(12) United States Patent
Kaida et al.

(10) Patent No.: US 7,112,881 B2
(45) Date of Patent: Sep. 26, 2006

(54) SEMICONDUCTOR DEVICE

(75) Inventors: Takayuki Kaida, Gifu (JP); Ryu Shimizu, Mizuho (JP); Mitsuru Okigawa, Nagoya (JP); Tetsuya Miwa, Gifu (JP); Takashi Noma, Ohta (JP)

(73) Assignee: Sanyo Electric Co., Ltd., Osaka (JP)

( * ) Notice: Subject to any disclaimer, the term of this patent is extended or adjusted under 35 U.S.C. 154(b) by 17 days.

(21) Appl. No.: 10/945,945

(22) Filed: Sep. 22, 2004

(65) Prior Publication Data

US 2005/0062146 A1    Mar. 24, 2005

(30) Foreign Application Priority Data

Sep. 24, 2003   (JP) ............................. 2003-331142

(51) Int. Cl.
 *H01L 23/48* (2006.01)
 *H01L 29/40* (2006.01)
 *H01L 23/43* (2006.01)

(52) U.S. Cl. .................. 257/698; 257/621; 257/708

(58) Field of Classification Search ........ 257/698–699, 257/621, 708, 773–774
See application file for complete search history.

(56) References Cited

U.S. PATENT DOCUMENTS 6,084,284 A * 7/2000 Adamic, Jr. ................ 257/773
6,646,289 B1   11/2003 Badehi
2002/0151171 A1  10/2002 Furusawa

FOREIGN PATENT DOCUMENTS

JP    2002-512436 A    4/2002
WO   WO 99/40624      8/1999

OTHER PUBLICATIONS

Korean Office Action for Corresponding Korean Patent Application No. 10-2004-76411, Dispatched Feb. 27, 2006.

* cited by examiner

*Primary Examiner*—Cuong Nguyen
(74) *Attorney, Agent, or Firm*—McDermott Will & Emery LLP

(57) ABSTRACT

A semiconductor device allowing simplification of a fabrication process is provided. This semiconductor device comprises a first insulator film, consisting of a single material, formed to be in contact with the upper surface of a semiconductor chip including a circuit, a first wire formed to be in contact with the upper surface of the first insulator film and a second wire formed to extend along the side surface and the lower surface of the semiconductor chip and connected to the lower surface of the first wire exposed by partially removing the first insulator film.

3 Claims, 20 Drawing Sheets

SEMICONDUCTOR DEVICE

BACKGROUND OF THE INVENTION

1. Field of the Invention

The present invention relates to a semiconductor device and a method of fabricating a semiconductor device, and more particularly, it relates to a semiconductor device comprising a semiconductor chip including a circuit and a method of fabricating a semiconductor device.

2. Description of the Background Art

A semiconductor device comprising a semiconductor chip including a circuit is known in general, as disclosed in Japanese National Patent Publication Gazette No. 2002-512436, for example.

The aforementioned Japanese National Patent Publication Gazette No. 2002-512436 discloses a structure of a semiconductor device comprising a semiconductor chip (die) including a circuit, an extension pad (metallic pad) connected to a circuit part of the surface of the semiconductor chip and a wire (metallic contact) connected to a conductive terminal (solderable bump) set under the semiconductor chip while connecting the wire to a side end surface of the extension pad exposed by machining.

In the structure of the semiconductor device disclosed in the aforementioned Japanese National Patent Publication Gazette No. 2002-512436, however, the surface of the side end of the extension pad exposed by machining is disadvantageously roughened. Further, chips resulting from the machining disadvantageously adhere to the side end of the extension pad. When the surface of the side end of the extension pad is roughened or chips adhere to this side end, it is disadvantageously difficult to excellently connect the wire to the side end of the extension pad.

In order to solve the problem of the semiconductor device disclosed in the aforementioned National Patent Publication Gazette No. 2002-512436, therefore, a structure of a semiconductor device obtained by removing an insulator film covering the lower surface of an extension pad by etching thereby exposing the lower surface of the extension pad while connecting a wire to the lower surface of the extension pad is proposed in general.

FIG. 36 is a side elevational view showing the overall structure of the aforementioned conventional proposed semiconductor device 150. FIG. 37 is a sectional view showing a structure in the vicinity of an end of the conventional proposed semiconductor device 150. In the conventional proposed semiconductor device 150, a glass substrate 103 is mounted on a semiconductor element 101 through a resin layer 102, as shown in FIG. 36. A plurality of semispherical conductive terminals 104 are provided on the lower surface of the semiconductor element 101. The semiconductor element 101 comprises a semiconductor chip 105, as shown in FIG. 36. This semiconductor chip 105 has a structure obtained by forming a circuit (not shown) on a silicon substrate. An insulator film 106 of SiO$_2$ is formed on the upper surface of the semiconductor chip 105. A plug electrode 107 is formed to be embedded in the insulator film 106. This plug electrode 107 is connected to the circuit (not shown) formed on the upper surface of the semiconductor chip 105.

An insulator film 110 of SiN is formed to cover the upper surface of the insulator film 106. A contact hole 112 is formed in a region of the insulator film 110 corresponding to the plug electrode 107. An extension pad 113 is formed on a prescribed region of the insulator film 110. A wire 114 is formed at a prescribed interval from the extension pad 113. This wire 114 is connected to the plug electrode 107 through the contact hole 112 of the insulator film 110. An insulator film 115 is formed to cover the overall surface. The insulator film 115 has an irregular upper surface reflecting the shapes of the extension pad 113 and the wire 114 formed at the prescribed interval. The resin layer 102 (see FIG. 36) is formed to fill up the irregular upper surface of the insulator film 115, and bonds the glass substrate 103 as an adhesive.

An insulator film 117 is formed to cover the side surface and the lower surface of the semiconductor chip 105 and a prescribed region of the lower surface of the insulator film 106. A buffer member 118 is provided on a prescribed region of the lower surface of the insulator film 117 corresponding to the lower surface of the semiconductor chip 105. A wire 116 is formed on the insulator film 117 and the buffer member 118 to extend along the side surface and the lower surface of the semiconductor chip 105. This wire 116 is connected to the lower surface of the extension pad 113 exposed by partially etching the insulator films 106 and 110. Each of the aforementioned semispherical conductive terminals 104 is provided on the lower surface of a region of the wire 116 corresponding to the buffer member 118. Thus, the extension pad 113 and the conductive terminal 104 are connected with each other through the wire 116. A further insulator film 108 is formed to cover a prescribed region of the wire 116 while a protective film 109 is formed to cover the insulator film 108.

FIGS. 38 to 54 are sectional views for illustrating a fabrication process for the conventional proposed semiconductor device 150 shown in FIG. 37. The fabrication process for the conventional proposed semiconductor device 150 shown in FIG. 37 is now described with reference to FIGS. 37 to 54.

As shown in FIG. 38, a semiconductor wafer 105a formed with circuits (not shown) on the upper surface thereof is prepared. The insulator film 106 of SiO$_2$ is formed on the semiconductor wafer 105a while plug electrodes 107 to be connected to the circuits (not shown) of the semiconductor wafer 105a are formed to be embedded in the insulator film 106. The insulator film 110 of SiN is formed to cover the insulator film 106 and the upper surfaces of the plug electrodes 107.

As shown in FIG. 39, contact holes 112 are formed in the regions of the insulator film 110 corresponding to the plug electrodes 107 by photolithography and etching.

As shown in FIG. 40, a metal layer 113a is formed to fill up the contact holes 112 of the insulator film 110 while covering the upper surface of the insulator film 110.

As shown in FIG. 41, the metal layer 113a is patterned by photolithography and etching thereby forming a plurality of extension pads 113 and a plurality of wires 114 at prescribed intervals.

As shown in FIG. 42, the insulator film 115 is formed to cover the overall surface.

As shown in FIG. 43, the resin layer 102 is formed to cover the upper surface of the insulator film 115 while bonding the glass substrate 103 as the adhesive.

Thereafter wet etching is performed from the lower surface of the semiconductor wafer 105a thereby separating the semiconductor wafer 105a into a plurality of semiconductor chips 105 as shown in FIG. 44.

As shown in FIG. 45, the insulator film 117 is formed to cover the lower surfaces and the side surfaces of the semiconductor chips 105 and the lower surface of the region of the insulator film 106 located between the adjacent pair of semiconductor chips 105.

As shown in FIG. 46, resist films 119 are formed to cover regions of the insulator film 117 corresponding to the side surfaces and the lower surfaces of the semiconductor chips 105 and partial regions located under the extension pads 113. The resist films 119 are employed as masks for performing wet etching from under the insulator film 106 with hydrofluoric acid thereby partially removing the insulator films 117 and 106 of $SiO_2$. Thus, the lower surface of a prescribed region of the insulator film 110 consisting of SiN is exposed as shown in FIG. 47. Further, wet etching is performed from the side of the exposed lower surface of the prescribed region of the insulator film 110 with hot phosphoric acid thereby removing the prescribed region of the insulator film 110 consisting of SiN. Thus, partial regions of the lower surfaces of the extension pads 113 and the region of the lower surface of the insulator film 115 located between the adjacent pair of extension pads 113 are exposed as shown in FIG. 48.

As shown in FIG. 49, buffer members 118 are formed on the regions of the insulator film 117 corresponding to the lower surfaces of the semiconductor chips 105.

As shown in FIG. 50, a metal layer 116a is formed to cover the exposed partial regions of the lower surfaces of the extension pads 113, the region of the lower surface of the insulator film 115 located between the adjacent pair of extension pads 113, the buffer members 118 and the insulator film 117.

As shown in FIG. 51, a region of the metal layer 116a located under the space between the adjacent pair of extension pads 113 is removed by photolithography and etching. Thus, the metal layer 116a is divided for the respective semiconductor chips 105, thereby forming two wires 116 connected to the lower surfaces of the extension pads 113 respectively.

As shown in FIG. 52, insulator films 108 are formed to cover prescribed regions of the wires 116 and prescribed regions of the lower surface of the insulator film 115. Thereafter the protective film 109 is formed to cover the insulator films 108 and the region of the lower surface of the insulator film 115 located between the adjacent pair of extension pads 113.

As shown in FIG. 53, the semispherical conductive terminals 104 are formed on the lower surfaces of regions of the wires 116 corresponding to the buffer members 118.

As shown in FIG. 54, dicing is performed from the lower side along the center line of the region located between the adjacent pair of semiconductor chips 105. Thus, the conventional proposed semiconductor device 150 is formed as shown in FIG. 37.

In the conventional proposed semiconductor device 150 shown in FIG. 37, however, the extension pad 113 for electrically connecting the semiconductor chip 105 and the external wire 116 with each other is formed to be in contact with the upper surface of the insulator film 110 of SiN formed on the insulator film 106 of $SiO_2$, and hence the insulator film 106 of $SiO_2$ and the insulator film 110 of SiN must disadvantageously be individually wet-etched with different etching solutions (hydrofluoric acid and hot phosphoric acid) respectively when the lower surface of the extension pad 113 is exposed for connecting the wire 116. Thus, the step for exposing the lower surface of the extension pad 113 is so complicated that the fabrication process for the semiconductor device 150 is also complicated.

SUMMARY OF THE INVENTION

The present invention has been proposed in order to solve the aforementioned problems, and an object of the present invention is to provide a semiconductor device allowing simplification of a fabrication process.

Another object of the present invention is to provide a method of fabricating a semiconductor device allowing simplification of a fabrication process.

In order to attain the aforementioned objects, a semiconductor device according to a first aspect of the present invention comprises a first insulator film, consisting of a single material, formed to be in contact with the upper surface of a semiconductor chip including a circuit, a first wire formed to be in contact with the upper surface of the first insulator film and a second wire formed to extend along the side surface and the lower surface of the semiconductor chip and connected to the lower surface of the first wire exposed by partially removing the first insulator film.

In the semiconductor device according to the first aspect, the first insulator film consisting of the single material is formed to be in contact with the upper surface of the semiconductor chip while the first wire is formed to be in contact with the upper surface of the first insulator film so that only the first insulator film consisting of the single material is present between the upper surface of the semiconductor chip and the first wire, whereby the insulator film located between the upper surface of the semiconductor chip and the first wire can be partially removed through a single etching step for exposing the lower surface of the first wire dissimilarly to a case where a plurality of insulator films of different materials are present between the upper surface of the semiconductor chip and the first wire. Thus, a fabrication process for the semiconductor device can be simplified. In this case, the first insulator film may consist of a single $SiO_2$ film.

The aforementioned semiconductor device according to the first aspect preferably further comprises a second insulator film, formed on the first insulator film, consisting of a material different from that of the first insulator film and having a first opening, and the lower surface of the first wire is preferably in contact with the upper surface of the first insulator film and the second wire through the first opening of the second insulator film. According to this structure, the first wire can be easily formed to be in contact with the upper surface of the first insulator film consisting of the single material also when the second insulator film consisting of the material different from that of the first insulator film is formed on the first insulator film. In this case, the second insulator film may consist of an SiN film.

In this case, the width of the first wire is preferably larger than the width of the first opening. According to this structure, an error in mask alignment with respect to a resist film for forming the first wire by patterning can be allowed due to the width of the first wire larger than that of the first opening. Thus, the first wire can be easily formed to fill up the first opening.

In the aforementioned structure including the second insulator film, the semiconductor device preferably further comprises a third wire formed on the second insulator film, and the second insulator film preferably includes a second opening for connecting the third wire and the circuit of the semiconductor chip with each other. According to this structure, the number of steps can be inhibited from increase also when providing the second opening in the second insulator film by forming the first and second openings in the second insulator film substantially through the same step, whereby the fabrication process can be inhibited from complication.

In this case, the third wire preferably consists of the same layer as the first wire. According to this structure, the first and third wires can be simultaneously formed by patterning the same layer, whereby the fabrication process can be simplified.

The aforementioned semiconductor device according to the first aspect preferably further comprises a third insulator film, provided between the semiconductor chip and the second wire to isolate the semiconductor chip and the second wire from each other and formed to cover a prescribed region of the lower surface of the first insulator film, consisting of a material removable by etching means substantially identical to that for the first insulator film. According to this structure, the first and third insulator films can be simultaneously partially removed by etching, whereby the number of steps for exposing the lower surface of the first wire can be inhibited from increase also when the third insulator film for isolating the semiconductor chip and the second wire from each other is provided to cover the prescribed region of the lower surface of the first insulator film.

In this case, the etching means preferably includes an etching solution employed for wet etching. According to this structure, the first and third insulator films can be easily partially removed by simultaneous wet etching with the same etching solution.

In the aforementioned structure including the third insulator film, the third insulator film preferably consists of the same material as the first insulator film. According to this structure, the first and third insulator films consisting of the same material can be easily partially removed by simultaneous etching with the same etching means.

A method of fabricating a semiconductor device according to a second aspect of the present invention comprises steps of forming a first insulator film consisting of a single material to be in contact with the upper surface of a semiconductor chip including a circuit, forming a first wire so that the lower surface thereof is in contact with the upper surface of the first insulator film, exposing the lower surface of the first wire by at least partially etching the first insulator film from the lower surface side and connecting a second wire to the exposed lower surface of the first wire.

In the method of fabricating a semiconductor device according to the second aspect, the first insulator film consisting of the single material is formed to be in contact with the upper surface of the semiconductor chip while the first wire is formed to be in contact with the upper surface of the first insulator film so that only the first insulator film consisting of the single material is present between the upper surface of the semiconductor chip and the first wire, whereby the insulator film located between the upper surface of the semiconductor chip and the first wire can be partially removed through a single etching step for exposing the lower surface of the first wire dissimilarly to a case where a plurality of insulator films of different materials are present between the upper surface of the semiconductor chip and the first wire. Thus, a fabrication process for the semiconductor device can be simplified. In this case, the first insulator film may consist of a single $SiO_2$ film.

The aforementioned method of fabricating a semiconductor device according to the second aspect preferably further comprises steps of forming a second insulator film consisting of a material different from that of the first insulator film on the first insulator film and forming a first opening in the second insulator film in advance of the step of forming the first wire so that the lower surface thereof is in contact with the upper surface of the first insulator film, and the step of forming the first wire so that the lower surface thereof is in contact with the upper surface of the first insulator film includes a step of forming the first wire so that the lower surface thereof is in contact with the upper surface of the first insulator film through the first opening of the second insulator film. According to this structure, the first wire can be easily formed to be in contact with the upper surface of the first insulator film consisting of the single material also when the second insulator film consisting of the material different from that of the first insulator film is formed on the first insulator film. In this case, the second insulator film may be formed by an SiN film.

In this case, the width of the first wire is preferably larger than the width of the first opening. According to this structure, an error in mask alignment with respect to a resist film for forming the first wire by patterning can be allowed due to the width of the first wire larger than that of the first opening. Thus, the first wire can be easily formed to fill up the first opening.

In the aforementioned structure including the step of forming the second insulator film, the method of fabricating a semiconductor device preferably further comprises a step of forming a third wire on the second insulator film, and the step of forming the first opening in the second insulator film preferably includes a step of substantially simultaneously forming the first opening and a second opening for connecting the third wire and the circuit of the semiconductor chip with each other in the second insulator film by etching the second insulator film. According to this structure, no etching step may be separately provided for forming the second opening in the second insulator film, whereby the fabrication process can be inhibited from complication.

In this case, the third wire preferably consists of the same layer as the first wire. According to this structure, the first and third wires can be simultaneously formed by patterning the same layer, whereby the fabrication process can be simplified.

The aforementioned method of fabricating a semiconductor device according to the second aspect preferably further comprises a step of forming a third insulator film consisting of a material removable by etching means substantially identical to that for the first insulator film to cover the lower surface of the first insulator film in advance of the step of exposing the lower surface of the first wire, and the step of exposing the lower surface of the first wire preferably includes a step of continuously partially etching the third insulator film and the first insulator film from the lower side by the identical etching means thereby exposing the lower surface of the first wire. According to this structure, the third and first insulator films can be partially removed through a single etching step for exposing the lower surface of the first wire, whereby the number of steps for exposing the lower surface of the first wire can be inhibited from increase also when the third insulator film for isolating the semiconductor chip and the second wire from each other is provided to cover the prescribed region of the lower surface of the first insulator film.

In this case, the etching means preferably includes an etching solution employed for wet etching. According to this structure, the first and third insulator films can be easily partially removed by simultaneous wet etching with the same etching solution.

In the aforementioned structure including the step of forming the third insulator film, the third insulator film preferably consists of the same material as the first insulator film. According to this structure, the first and third insulator films consisting of the same material can be easily partially removed by simultaneous etching with the same etching means.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

FIRST EMBODIMENT

The structure of a semiconductor device 50 according to a first embodiment of the present invention is described with reference to FIGS. 1 and 2.

Figure 1:
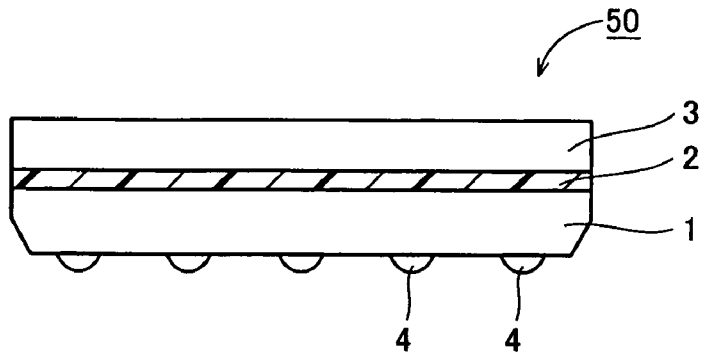
FIG. 1 is a side elevational view showing the overall structure of a semiconductor device according to a first embodiment of the present invention.

In the semiconductor device 50 according to the first embodiment, a glass substrate 3 having a thickness of about 400 μm is mounted on a semiconductor element 1 through a resin layer 2 of epoxy resin having a thickness of about 5 μm to about 20 μm, as shown in FIG. 1. A plurality of semispherical conductive terminals 4 made of solder are provided on the lower surface of the semiconductor element 1.

Figure 2:
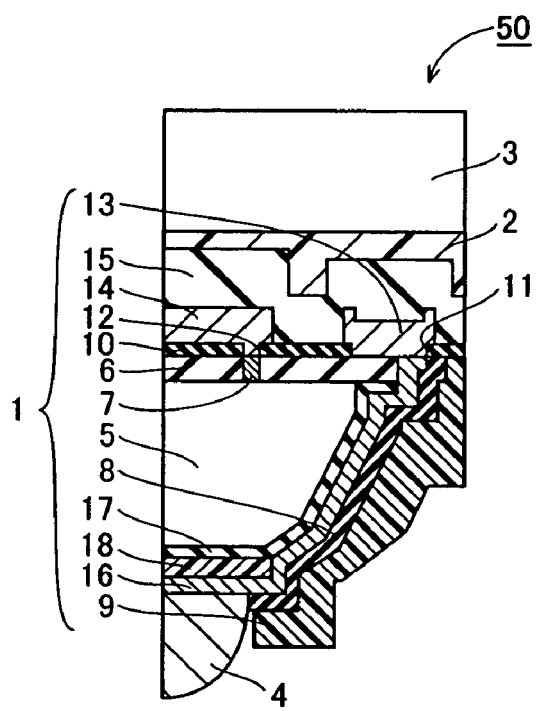
FIG. 2 is a sectional view showing the structure of a portion around an end of the semiconductor device according to the first embodiment shown in FIG. 1.

The semiconductor element 1 comprises a semiconductor chip 5 having a thickness of about 150 μm to about 600 μm, as shown in FIG. 2. This semiconductor chip 5 has a structure obtained by forming a circuit (not shown) on the upper surface of a silicon substrate. An insulator film 6 of $SiO_2$ having a thickness of about 1000 nm to about 2000 nm is formed on the upper surface of the semiconductor chip 1. This insulator film 6 is an example of the "first insulator film" in the present invention. A plug electrode 7 of a metallic material such as W is formed to be embedded in the insulator film 6. This plug electrode 7 is connected to the circuit (not shown) formed on the upper surface of the semiconductor chip 5. An insulator film 10 of SiN is formed to cover the upper surface of the insulator film 6 and upper end surfaces of an insulator film 8 and a protective film 9 described later. An opening 11 is formed in a prescribed region of the insulator film 10, while a contact hole 12 is formed in a region corresponding to the plug electrode 7. The opening 11 is an example of the "first opening" in the present invention, and the contact hole 12 is an example of the "second opening" in the present invention.

According to the first embodiment, an extension pad 13 of a metallic material such as Al having a thickness of about 500 nm to about 100 nm is formed to fill up the opening 11 of the insulator film 10 while partially extending on the upper surface of the insulator film 10. The width of the extension pad 13 is larger than that of the opening 11.

Thus, the extension pad 13 is in contact with the upper surface of the insulator film 6 through the opening 11 of the insulator film 10. This extension pad 13 is provided for connecting the circuit of the semiconductor chip 5 and a wire 16 described later with each other. The extension pad 13 is an example of the "first wire" in the present invention.

A wire 14 of a metallic material such as Al having a thickness of about 500 nm to about 1000 nm is formed at a prescribed interval from the extension pad 13. The wire 14 is connected to the plug electrode 7 through the contact hole 12 of the insulator film 10. This wire 14 is an example of the "third wire" in the present invention. The wire 14 is connected with the extension pad 13, which in turn is connected to the circuit of the semiconductor chip 5, although this connection is not illustrated.

An insulator film 15 of SiN having a thickness of about 500 nm to about 2000 nm is formed to cover the overall surface. The insulator film 15 has an irregular upper surface reflecting the shapes of the extension pad 13 and the wire 14 set at the prescribed interval. The aforementioned resin layer 2 (see FIG. 1) is formed to fill up the irregular upper surface of the insulator film 15, while bonding the glass substrate 3 as an adhesive.

According to the first embodiment, an insulator film 17 for isolating the semiconductor chip 5 and a wire 16 described later from each other is formed to cover the side surface and the lower surface of the semiconductor chip 5 and a prescribed region of the lower surface of the insulator film 6. The insulator film 17, consisting of $SiO_2$ identically to the insulator film 6, is formed to have a thickness of about 1 μm to about 5 μm. The insulator film 17 is an example of the "third insulator film" in the present invention. A buffer member 18 of epoxy resin having a thickness of about 10 μm to about 30 μm is provided on the lower surface of a prescribed region of the insulator film 17 corresponding to the lower surface of the semiconductor chip 5. This buffer member 18 is provided for relaxing impact in formation of each conductive terminal 4 on the wire 16. The wire 16 of a metallic material such as Al having a thickness of about 2 μm to about 3 μm is formed on the insulator film 17 and the buffer member 18 to extend along the side surface and the lower surface of the semiconductor chip 5. This wire 16 is an example of the "second wire" in the present invention. The wire 16 is connected to the lower surface of the extension pad 13 exposed by partially etching the insulator film 6. Each of the aforementioned semispherical conductive terminals 4 of solder is provided on the lower surface of a region of the wire 16 corresponding to the buffer member 18. Thus, the extension pad 13 and the conductive terminal 4 are connected with each other through the wire 16. The insulator film 8 is formed to cover a prescribed region of the wire 16, while the protective film 9 of epoxy resin having a thickness of about 10 μm to about 30 μm is formed to cover the insulator film 8.

A fabrication process for the semiconductor device 5 according to the first embodiment of the present invention is described with reference to FIGS. 2 to 18.

Figure 3:
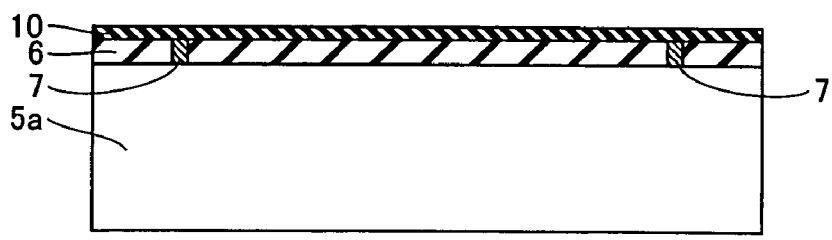
FIGS. 3 to 18 are sectional views for illustrating a fabrication process for the semiconductor device according to the first embodiment of the present invention.

As shown in FIG. 3, a semiconductor wafer 5a obtained by forming circuits (not shown) on the upper surface of a silicon substrate is prepared. The insulator film 6 of $SiO_2$ having the thickness of about 1000 nm to about 2000 nm is formed on the semiconductor wafer 5a while plug electrodes 7 of W or the like to be connected to the circuits (not shown) of the semiconductor wafer 5a are formed to be embedded in the insulator film 6. The insulator film 10 of SiN having the thickness of about 500 nm is formed to cover the upper surfaces of the insulator film 6 and the plug electrodes 7.

Figure 4:
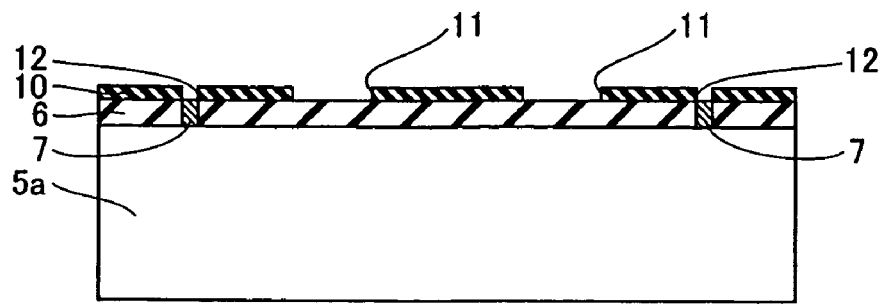

According to the first embodiment, openings 11 are formed in prescribed regions of the insulator film 10 while contact holes 12 are simultaneously formed in regions of the insulator film 10 corresponding to the plug electrodes 7 by photolithography and etching, as shown in FIG. 4.

Figure 5:
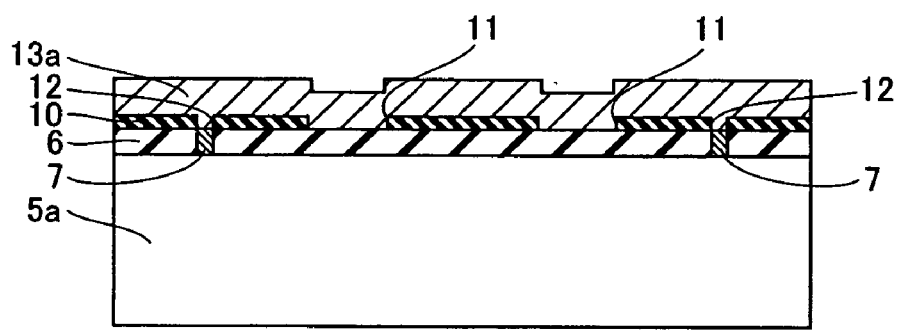

As shown in FIG. 5, a metal layer 13a of Al having a thickness of about 500 nm to about 1000 nm is formed to fill up the openings 11 and the contact holes 12 of the insulator film 10 while covering the upper surface of the insulator film 10. Thus, the metal layer 13a is partially in contact with the upper surface of the insulator film 6 through the openings 11 of the insulator film 10 and partially connected to the plug electrodes 7 through the contact holes 12 of the insulator film 10.

Figure 6:
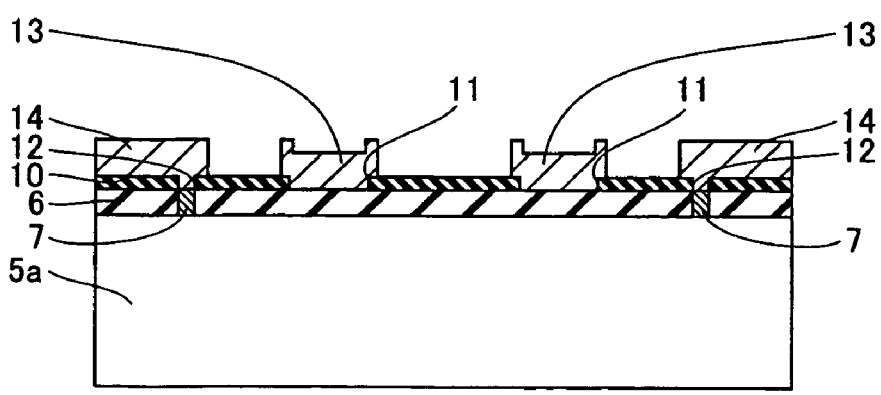

As shown in FIG. 6, the metal layer 13a is patterned by photolithography and etching, thereby forming a plurality of extension pads 13 and a plurality of wires 14 at prescribed intervals. Thus, the wires 14 are connected to the plug electrodes 7 through the contact holes 12 of the insulator film 10 and the extension pads 13 are brought into contact with the upper surface of the insulator film 6 through the openings 11 of the insulator film 10. At this time, the width of the extension pads 13 is rendered larger than the size of the openings 11 of the insulator film 10.

Figure 7:
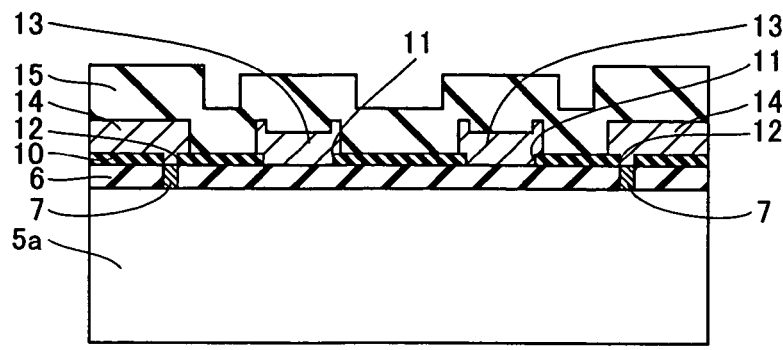

As shown in FIG. 7, the insulator film 15 of SiN having the thickness of about 500 nm to about 2000 nm is formed by CVD (chemical vapor deposition) to cover the overall surface. Thus, the insulator film 15 has the irregular upper surface reflecting the shapes of the extension pads 13 and the wires 14 formed at the prescribed intervals.

Figure 8:
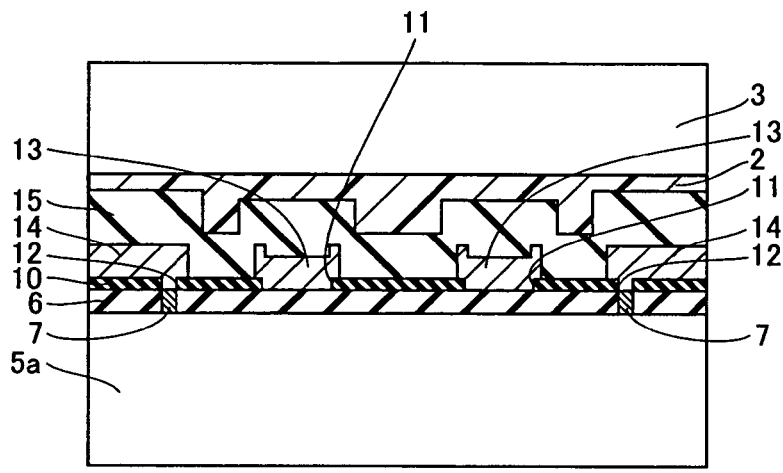
Figure 9:
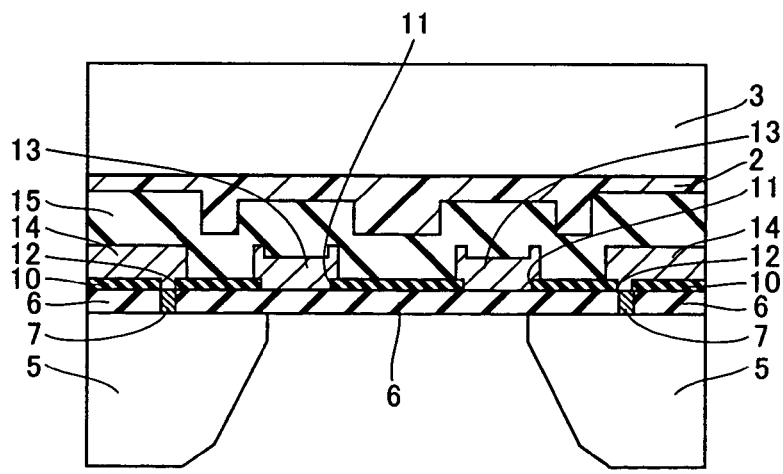

As shown in FIG. 8, the resin layer 2 of epoxy resin having the thickness of about 5 μm to about 20 μm is formed to cover the irregular upper surface of the insulator film 15 and employed as the adhesive for bonding the glass substrate 3 having the thickness of about 400 nm. Thereafter wet etching is performed from the lower surface side of the semiconductor wafer 5a (see FIG. 8), thereby separating the semiconductor wafer 5a into a plurality of semiconductor chips 5 as shown in FIG. 9. A mixed solution of hydrofluoric acid, nitric acid and acetic acid or the like is employed for this wet etching.

Figure 10:
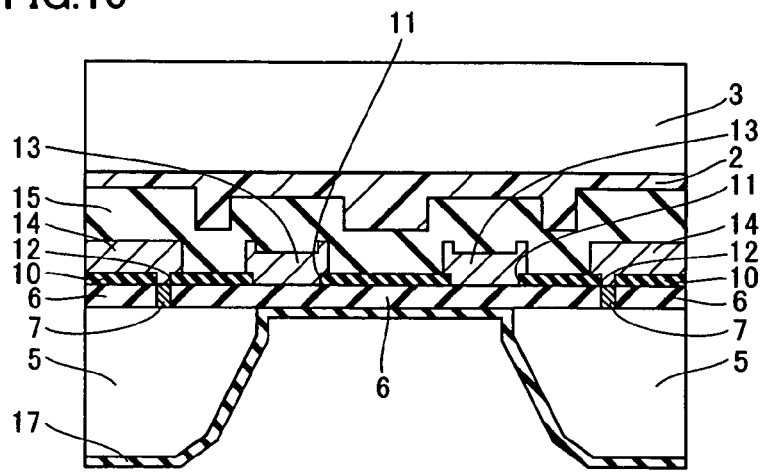

As shown in FIG. 10, the insulator film 17 of $SiO_2$ is formed by CVD to cover the lower surfaces and the side surfaces of the semiconductor chips 5 and the lower surface of a region of the insulator film 6 located between the adjacent pair of semiconductor chips 5. This insulator film 17 is formed to have the thickness of about 1 μm to about 5 μm.

Figure 11:
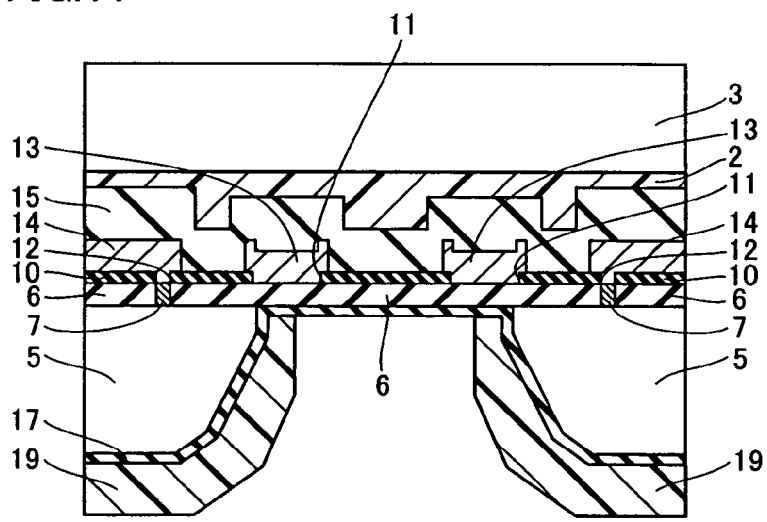

As shown in FIG. 11, resist films 19 having a thickness of about 10 μm to about 50 μm are formed to cover regions of the insulator film 17 corresponding to the side surfaces and the lower surfaces of the semiconductor chips 5 and partial regions located under the extension pads 13.

Figure 12:
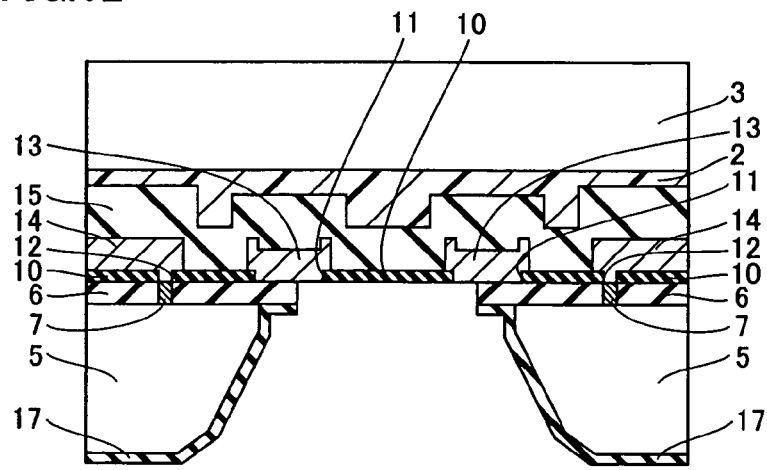

According to the first embodiment, the resist films 19 are employed as masks for performing wet etching from under the insulator films 17 and 6 with hydrofluoric acid or the like, thereby exposing partial regions of the lower surfaces of the extension pads 13 and the lower surface of the region of the insulator film 10 located between the adjacent pair of extension pads 13, as shown in FIG. 12. At this time, the insulator films 17 and 6 of $SiO_2$ can be partially removed through the single etching step.

Figure 13:
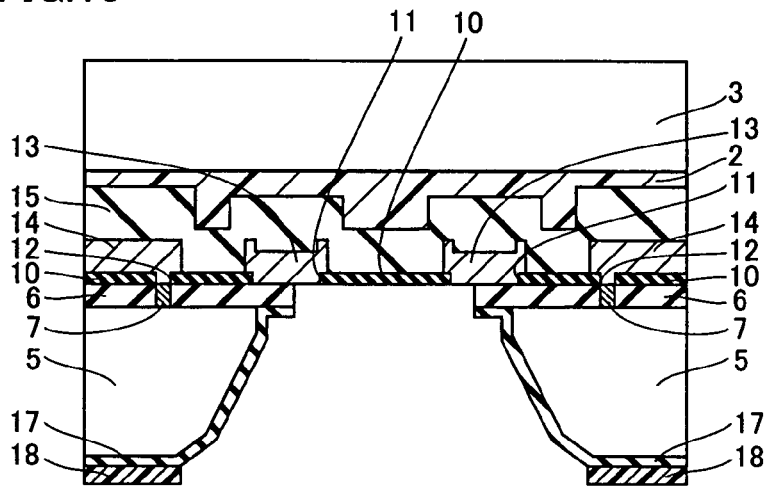

As shown in FIG. 13, buffer members 18 of epoxy resin having the thickness of about 10 μm to about 30 μm are formed on regions of the insulator film 17 corresponding to the lower surfaces of the semiconductor chips 5.

Figure 14:
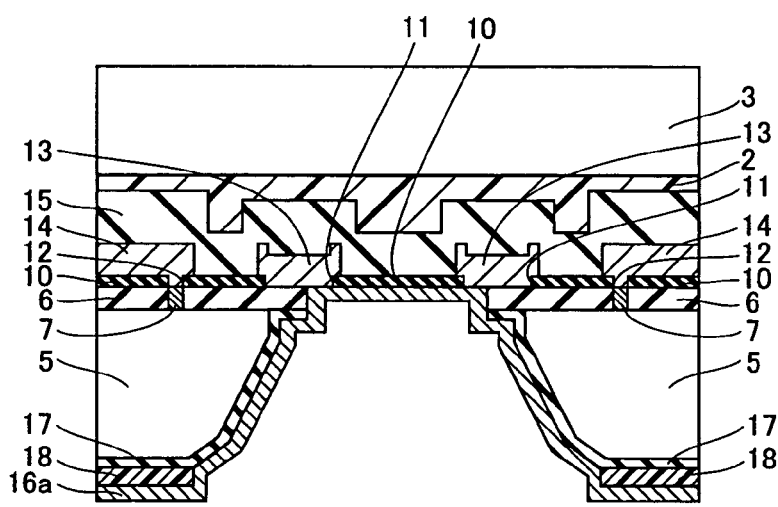

As shown in FIG. 14, a metal layer 16a of a metal such as Al having a thickness of about 2 μm to about 3 μm is formed to cover the exposed partial regions of the lower surfaces of the extension pads 13, the lower surface of the region of the insulator film 10 located between the pair of adjacent extension pads 13, the buffer members 18 and the insulator film 17.

Figure 15:
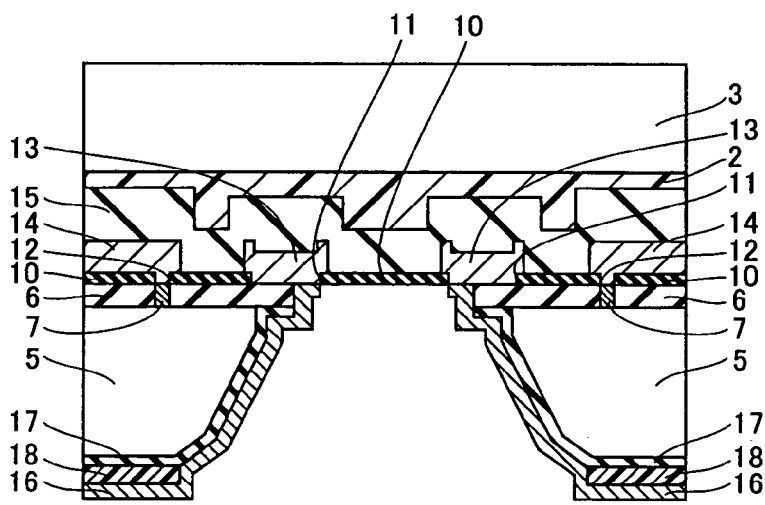

As shown in FIG. 15, a region of the metal layer 16a located under the space between the pair of adjacent extension pads 13 is removed by photolithography and etching. Thus, the metal layer 16a is divided for the respective semiconductor chips 5, thereby forming two wires 16 connected to the lower surfaces of the extension pads 13 respectively.

Figure 16:
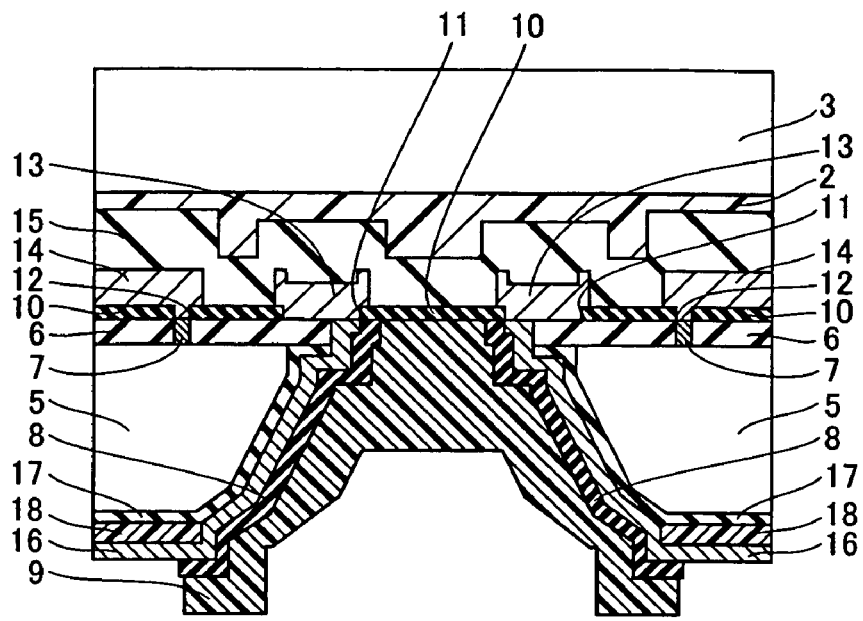

As shown in FIG. 16, insulator films 8 are formed to cover the wires 16 and prescribed regions of the lower surface of the insulator film 10. Thereafter the protective film 9 of epoxy resin having the thickness of about 10 μm to about 30 μm is formed to cover the insulator films 8 and the lower surface of the region of the insulator film 10 located between the adjacent pair of extension pads 13.

Figure 17:
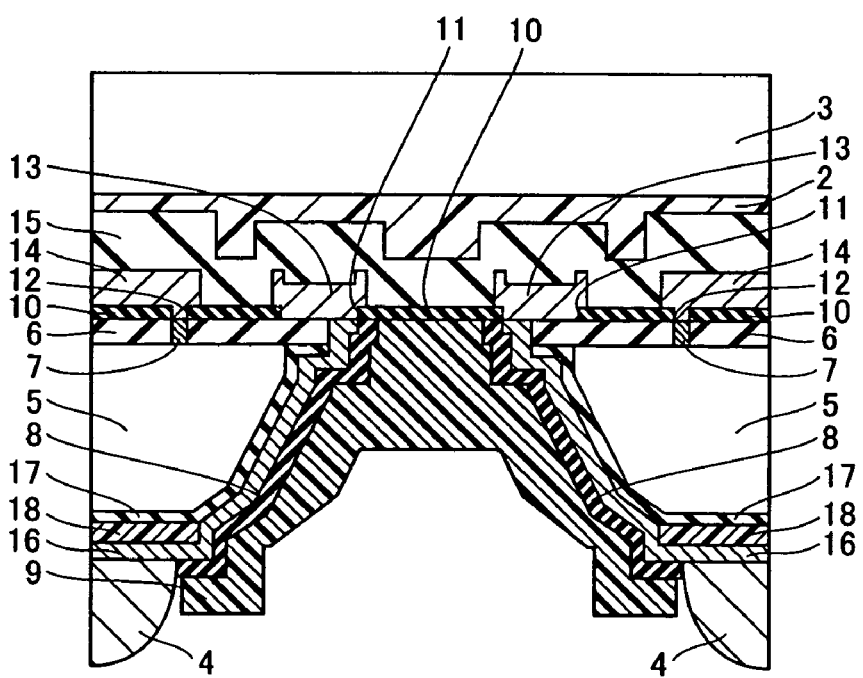

As shown in FIG. 17, solder is applied to the lower surfaces of regions of the wires 16 corresponding to the buffer members 18 by screen printing or the like, thereby forming semispherical conductive terminals 4.

Figure 18:
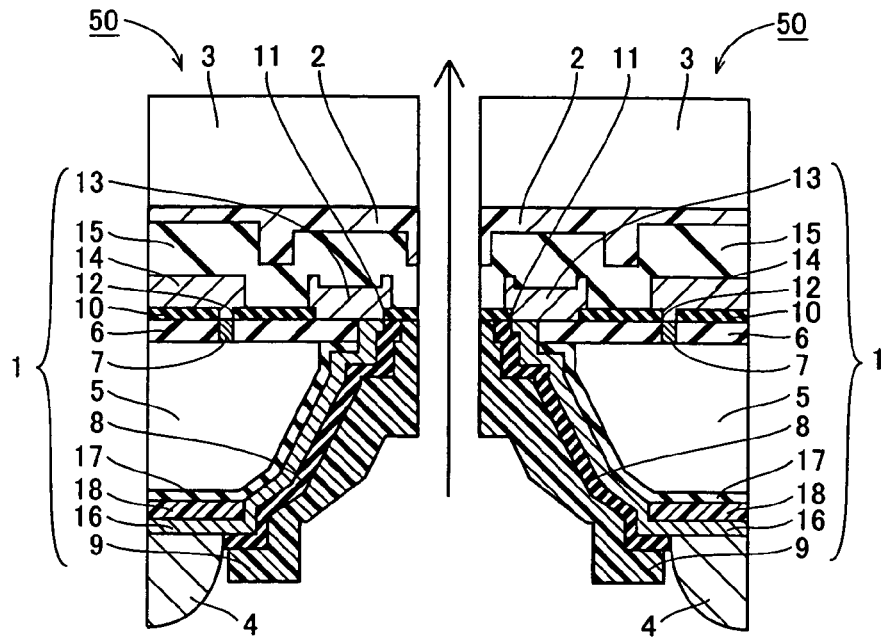

As shown in FIG. 18, dicing is performed from the lower side along the center line of the region located between the adjacent pair of semiconductor chips 5. Thus, the semiconductor device 50 according to the first embodiment is formed as shown in FIG. 2.

According to the first embodiment, as hereinabove described, the insulator film 6 consisting of the single material ($SiO_2$) is formed to be in contact with the upper surface of the semiconductor chip 5 while the extension pad 13 is formed to be in contact with the upper surface of the insulator film 6 through the opening 11 of the insulator film 10 consisting of SiN formed on the insulator film 6 so that only the insulator film 6 consisting of the single material ($SiO_2$) is present between the upper surface of the semiconductor chip 5 and the extension pad 13, whereby the insulator film 6 located between the upper surface of the semiconductor chip 5 and the extension pad 13 can be partially removed through the single etching step for exposing the lower surface of the extension pad 13, dissimilarly to a case where a plurality of insulator films of different materials are present between the upper surface of the semiconductor chip 5 and the extension pad 13. Thus, the fabrication process for the semiconductor device 50 can be simplified.

According to the first embodiment, the opening 11 and the contact hole 12 are substantially simultaneously formed in the insulator film 10 by etching the insulator film 10 so that no step of etching the insulator film 10 may be separately provided for forming the contact hole 12, whereby the fabrication process can be inhibited from complication.

According to the first embodiment, the insulator film 17 for isolating the semiconductor chip 5 and the wire 16 from each other is made of the same material ($SiO_2$) as the insulator film 6 formed to cover the lower surface of the extension pad 13 so that the lower surface of the extension pad 13 can be exposed by partially removing the insulator films 6 and 17 through single etching after forming the insulator film 17 to cover the lower surface of the insulator film 6, whereby the number of steps for exposing the lower surface of the extension pad 13 can be inhibited from increase.

According to the first embodiment, the width of the extension pad 13 is rendered larger than that of the opening 11 of the insulator film 10, whereby an error in mask alignment with respect to a resist film for forming the extension pad 13 by patterning can be allowed due to the width of the extension pad 13 larger than that of the opening 11. Thus, the extension pad 13 can be easily formed to fill up the opening 11.

According to the first embodiment, the wire 14 and the extension pad 13 are so made of the same metal layer 13a that the wire 14 and the extension pad 13 can be simultaneously formed by patterning the same metal layer 13a, whereby the fabrication process can be simplified.

SECOND EMBODIMENT

Figure 19:
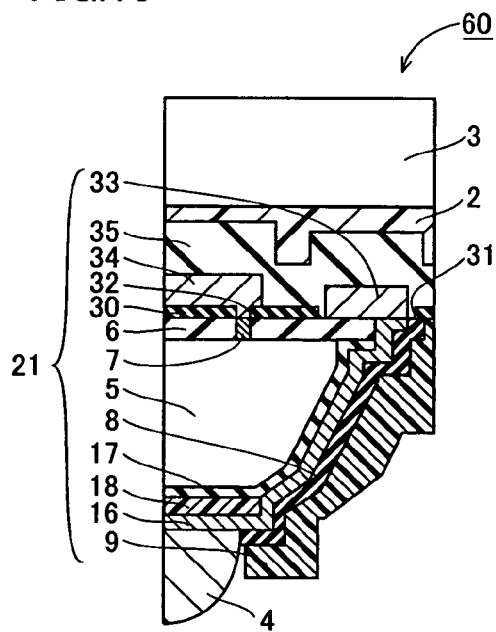
FIG. 19 is a sectional view showing the structure of a portion around an end of a semiconductor device according to a second embodiment of the present invention.

In a semiconductor device 60 according to a second embodiment of the present invention, the width of an extension pad 33 is rendered smaller than the size of an opening 31 of an insulator film 30, dissimilarly to the aforementioned first embodiment. The structure of the semiconductor device 60 according to the second embodiment is now described with reference to FIG. 19. Referring to FIG. 19, elements identical to those of the first embodiment are denoted by the same reference numerals.

In the semiconductor device 60 according to the second embodiment, the insulator film 30 of SiN is provided to cover the upper surface of an insulator film of $SiO_2$ formed on the upper surface of a semiconductor chip 5 and upper end surfaces of an insulator film 8 and a protective film 9, as shown in FIG. 19. The opening 31 is provided in a prescribed region of the insulator film 30, while a contact hole 32 is provided in a region corresponding to a plug electrode 7 connected to a circuit of the semiconductor chip 5. According to the second embodiment, the opening 31 is formed to have a larger width than the opening 11 according to the first embodiment shown in FIG. 2. The insulator film 30 is an example of the "second insulator film" in the present invention. The opening 31 is an example of the "first opening" in the present invention, and the contact hole 32 is an example of the "second opening" in the present invention.

According to the second embodiment, the extension pad 33 of a metallic material such as al having a thickness of about 500 nm to about 1000 nm is formed in the opening 31 of the insulator film 30. Thus, the extension pad 33 is in contact with the upper surface of the insulator film 6 through the opening 31 of the insulator film 30. The width of the extension pad 33 is rendered smaller than the size of the opening 31 of the insulator film 30. In other words, the extension pad 33 is formed only in the opening 31 not to partially extend on the insulator film 30 according to the second embodiment, dissimilarly to the extension pad 13 according to the first embodiment shown in FIG. 2. The extension pad 33 is an example of the "first wire" in the present invention. A wire 34 of a metallic material such as Al having a thickness of about 500 nm to about 1000 nm is provided to cover the contact hole 32 of the insulator film 30. This wire 34 is connected to the plug electrode 7 formed to be embedded in the insulator film 6 through the contact hole 32 of the insulator film 30. The wire 34 is an example of the "third wire" in the present invention. The wire 34 is connected with the extension pad 33, which in turn is connected to the circuit of the semiconductor chip 5, although this connection is not illustrated. An insulator film 35 of SiN having a thickness of about 500 nm to about 2000 nm is formed to cover the overall surface.

The remaining structure of the semiconductor device 60 according to the second embodiment is similar to that of the semiconductor device 50 according to the first embodiment.

A fabrication process for the semiconductor device 60 according to the second embodiment of the present invention is now described with reference to FIGS. 19 to 35.

Figure 20:
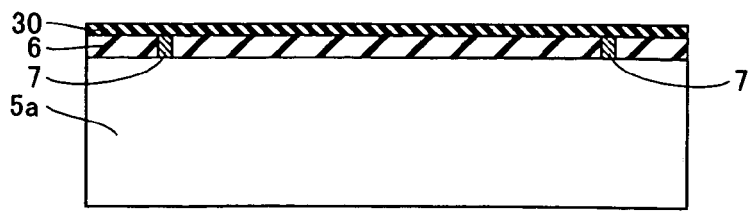
FIGS. 20 to 35 are sectional views for illustrating a fabrication process for the semiconductor device according to the second embodiment of the present invention.

As shown in FIG. 20, the insulator film 6 of $SiO_2$ and plug electrodes 7 are formed on a semiconductor wafer 5a formed with circuits (not shown) on the upper surface thereof, and the insulator film 50 of SiN having the thickness of about 500 nm is thereafter formed to cover the upper surfaces of the insulator film 6 and the plug electrodes 7, similarly to the fabrication process according to the first embodiment shown in FIG. 3.

Figure 21:
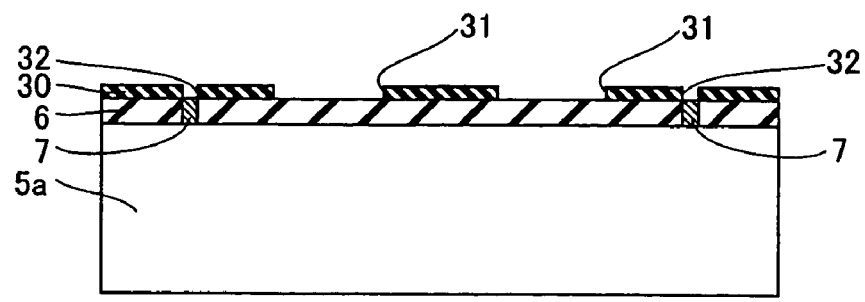

According to the second embodiment, openings 31 are formed in prescribed regions of the insulator film 30 while contact holes 32 are simultaneously formed in regions of the insulator film 30 corresponding to the plug electrodes 7 by photolithography and etching, as shown in FIG. 21. In this case, the openings 31 are formed to have a width larger than that of the openings 11 according to the first embodiment shown in FIG. 4.

Figure 22:
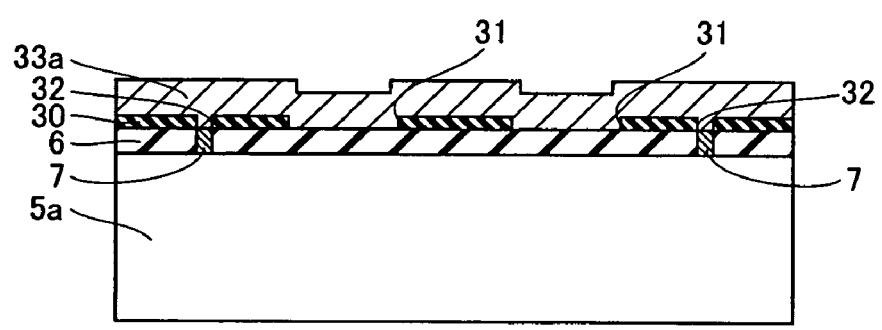

As shown in FIG. 22, a metal layer 33a of Al having a thickness of about 500 nm to about 1000 nm is formed to fill up the openings 31 and the contact holes 32 of the insulator film 30 while covering the upper surface of the insulator film 30. Thus, the metal layer 33a is partially in contact with the upper surface of the insulator film 6 through the openings 31 of the insulator film 30 and partially connected to the plug electrodes 7 through the contact holes 32 of the insulator film 30.

Figure 23:
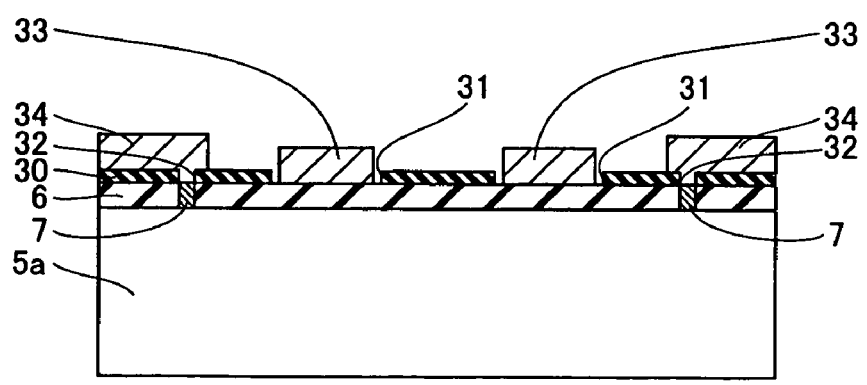

As shown in FIG. 23, the metal layer 33a is patterned by photolithography and etching thereby forming a plurality of extension pads 33 and a plurality of wires 34 at prescribed intervals. Thus, the wires 34 are connected to the plug electrodes 7 through the contact holes 32 of the insulator film 30 and the extension pads 33 are brought into contact with the upper surface of the insulator film 6 through the openings 31 of the insulator film 30. At this time, the width of the extension pads 33 is rendered smaller than the size of the openings 31 of the insulator film 30. In other words, the extension pads 33 are formed only in the openings 31 not to partially extend on the insulator film 30 according to the second embodiment.

Figure 24:
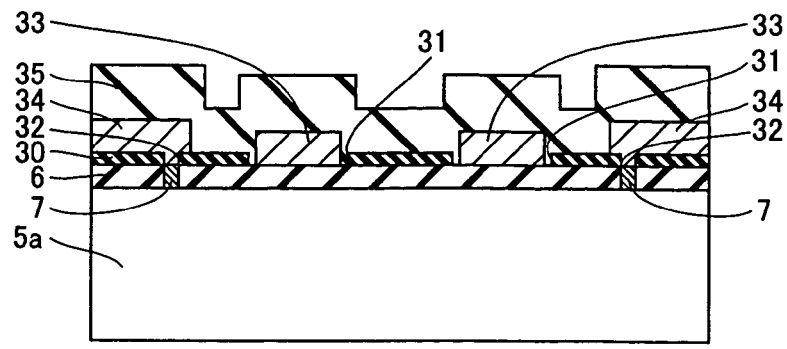
Figure 25:
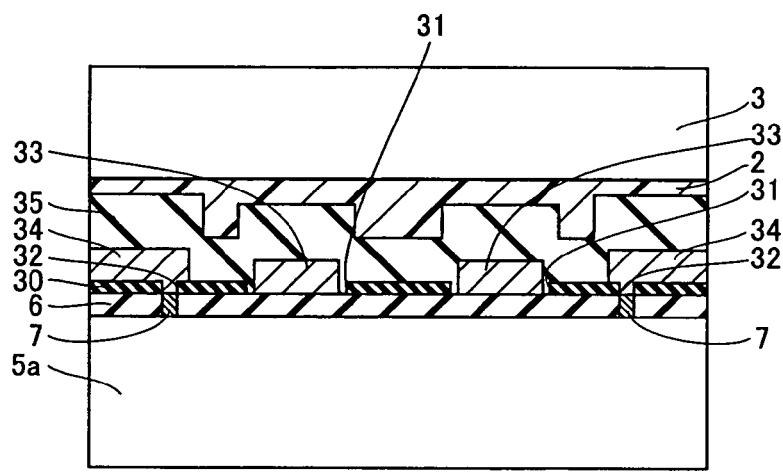
Figure 26:
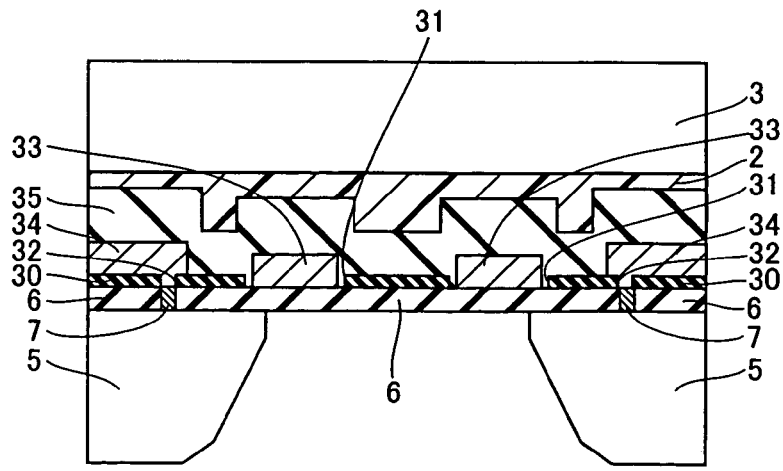
Figure 27:
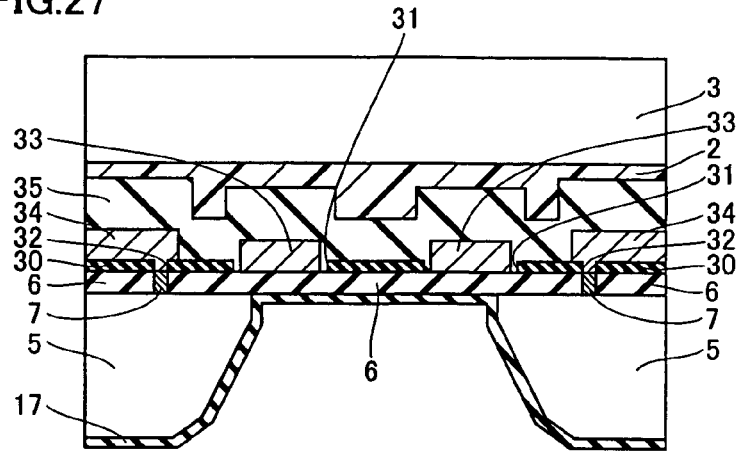

Steps similar to those of the aforementioned first embodiment shown in FIGS. 7 to 9 are carried out as shown in FIGS. 24 to 26, and the insulator film 17 of $SiO_2$ is thereafter formed by CVD to cover the lower surfaces and the side surfaces of semiconductor chips 5 and the lower surface of a region of the insulator film 6 located between the adjacent pair of semiconductor chips 5, as shown in FIG. 27.

Figure 28:
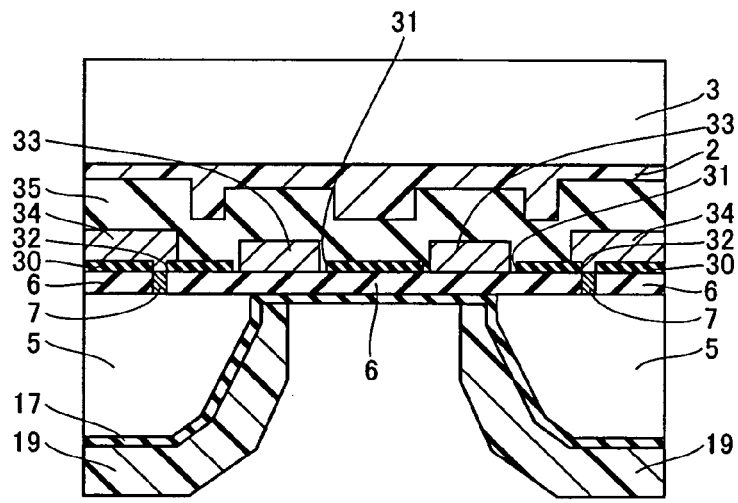

As shown in FIG. 28, resist films 39 having a thickness of about 10 μm to about 50 μm are formed to cover regions of the insulator film 17 corresponding to the side surfaces and the lower surfaces of the semiconductor chips 5 and partial regions located under the extension pads 33.

Figure 29:
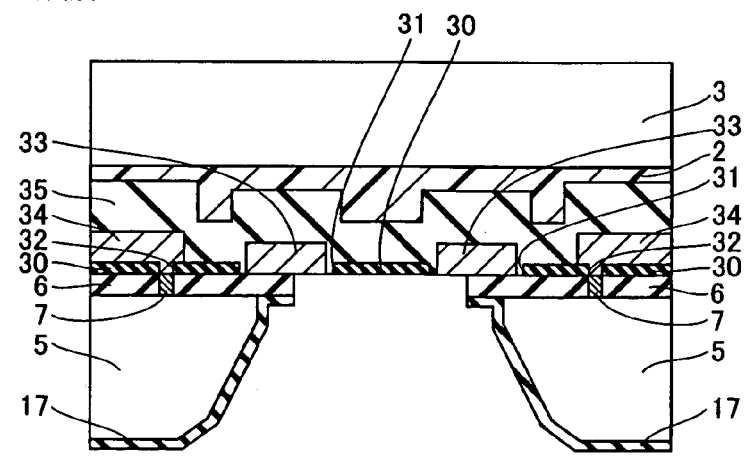
Figure 30:
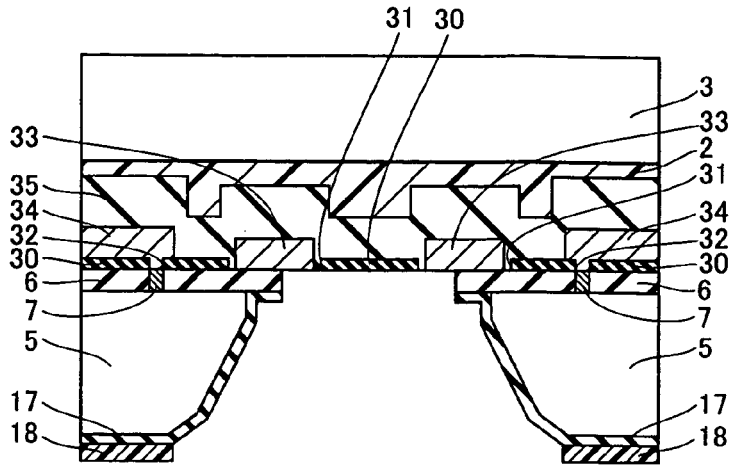
Figure 31:
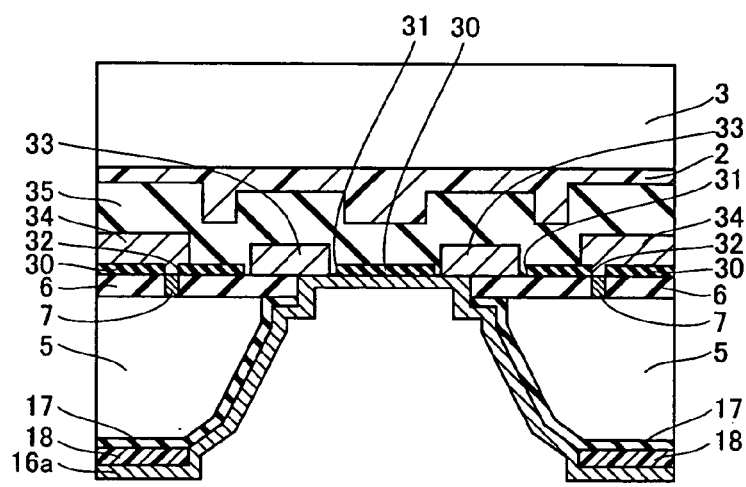
Figure 32:
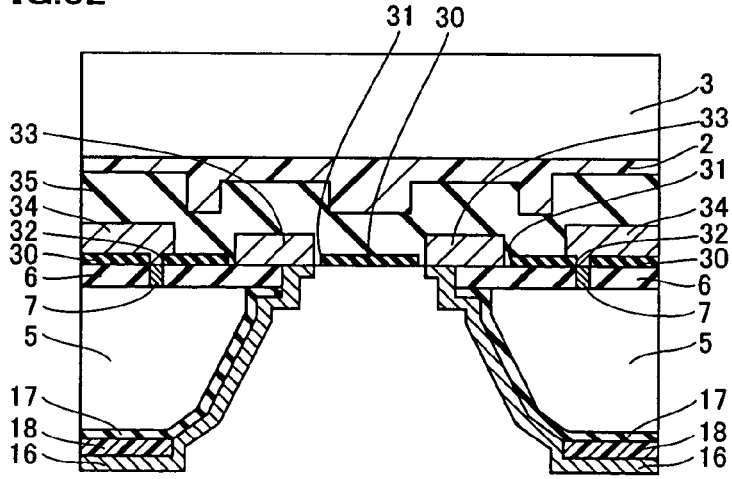
Figure 33:
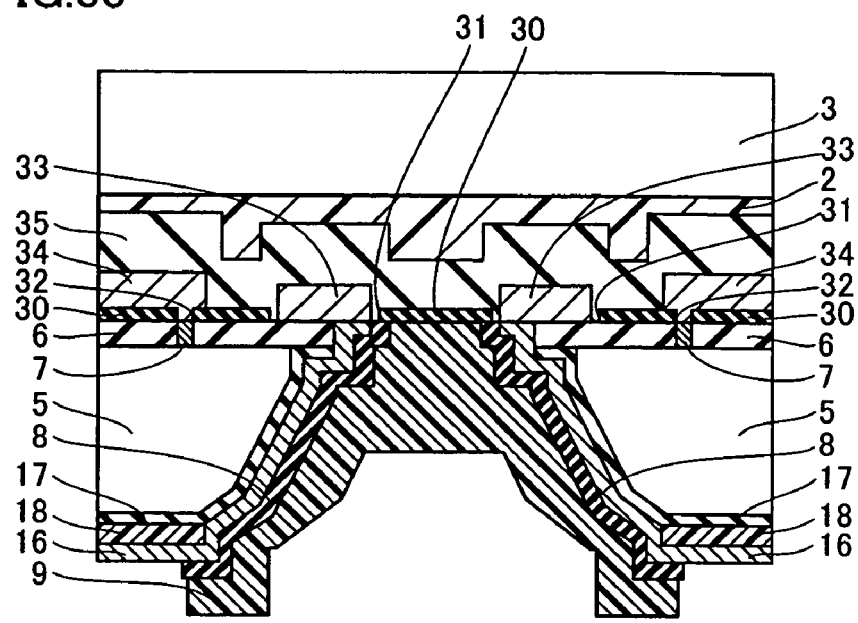
Figure 34:
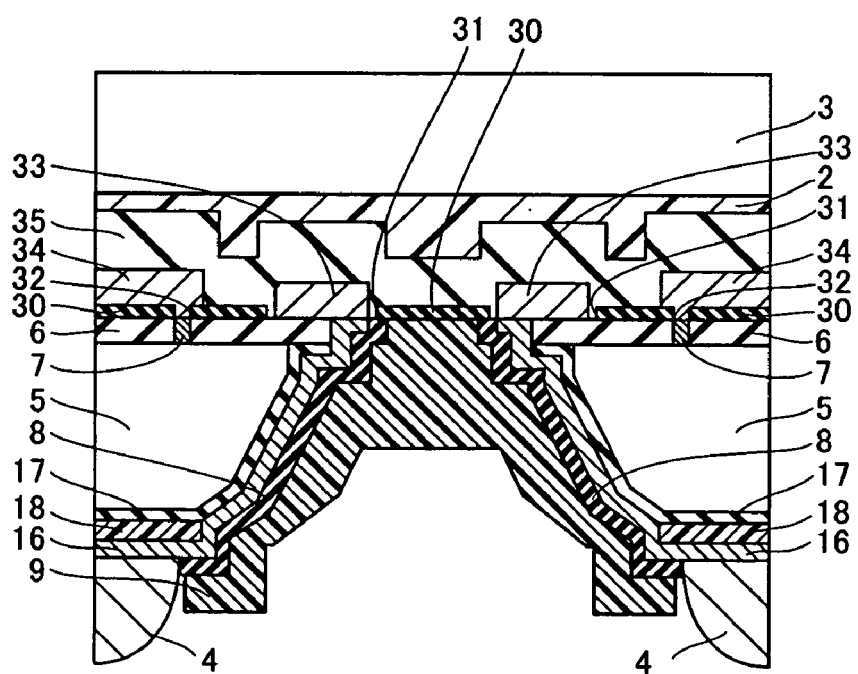
Figure 35:
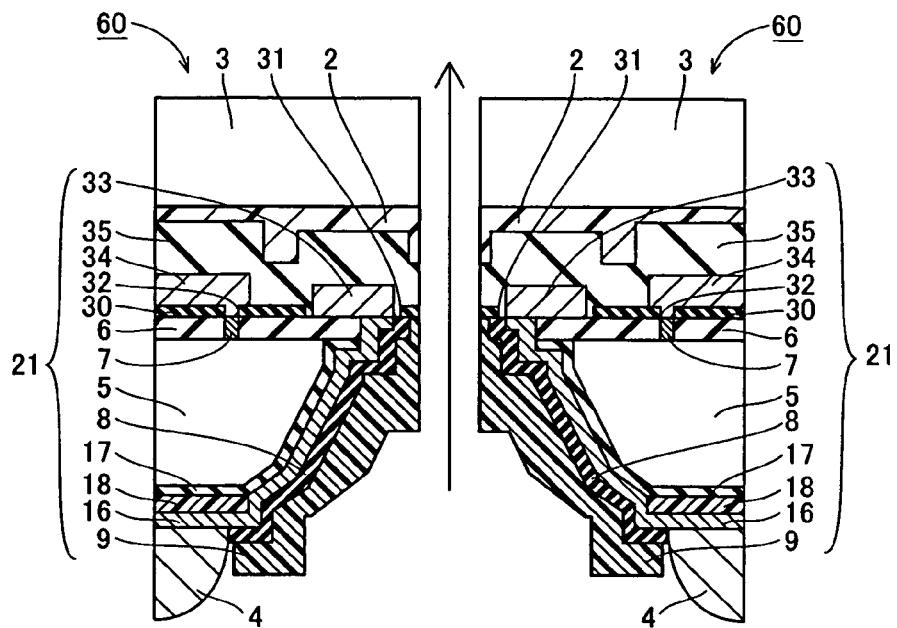
Figure 36:
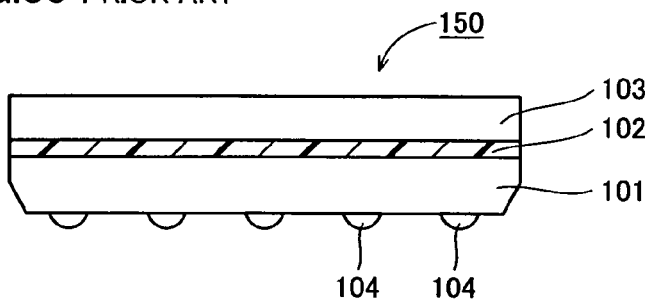
FIG. 36 is a side elevational view showing the overall structure of a conventional proposed semiconductor device.
Figure 37:
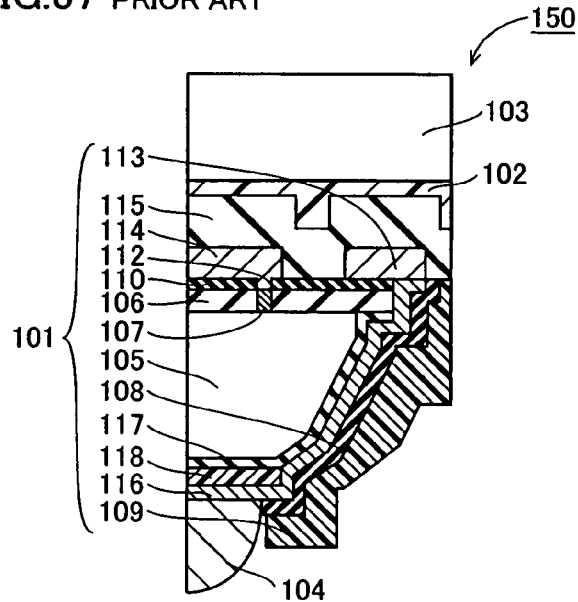
FIG. 37 is a sectional view showing the structure of a portion around an end of the conventional proposed semiconductor device shown in FIG. 36.
Figure 38:
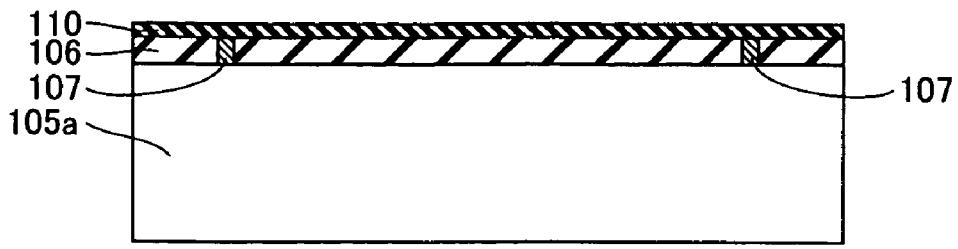
FIGS. 38 to 54 are sectional views for illustrating a fabrication process for the conventional proposed semiconductor device.
Figure 39:
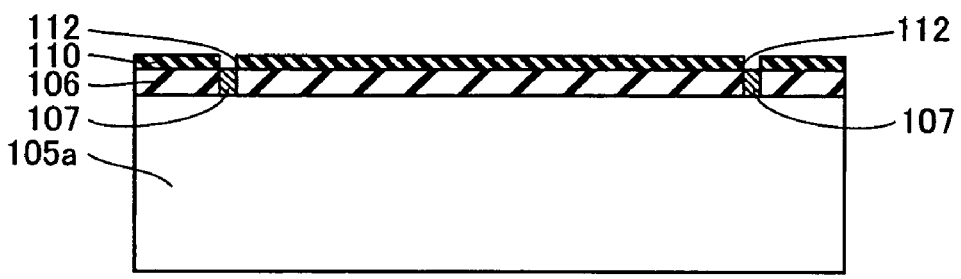
Figure 40:
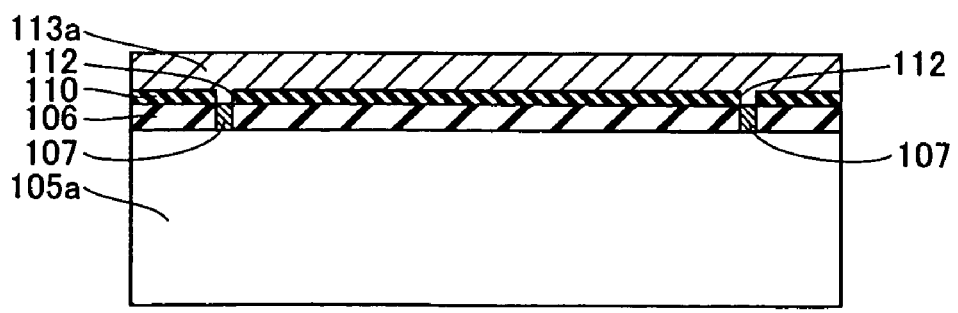
Figure 41:
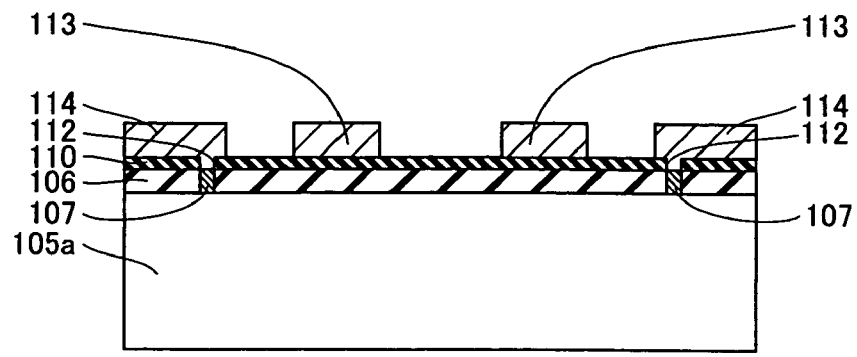
Figure 42:
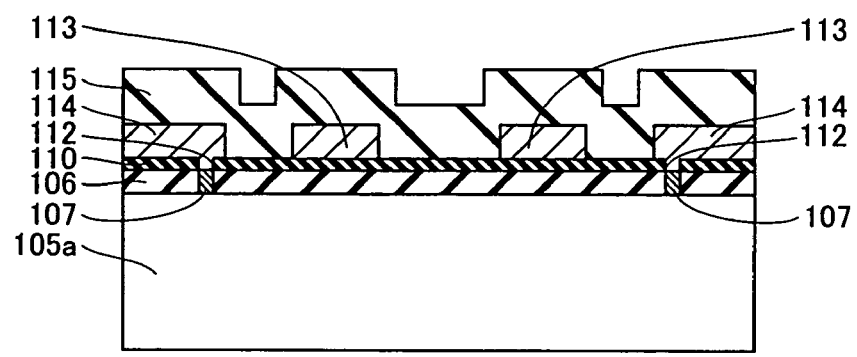
Figure 43:
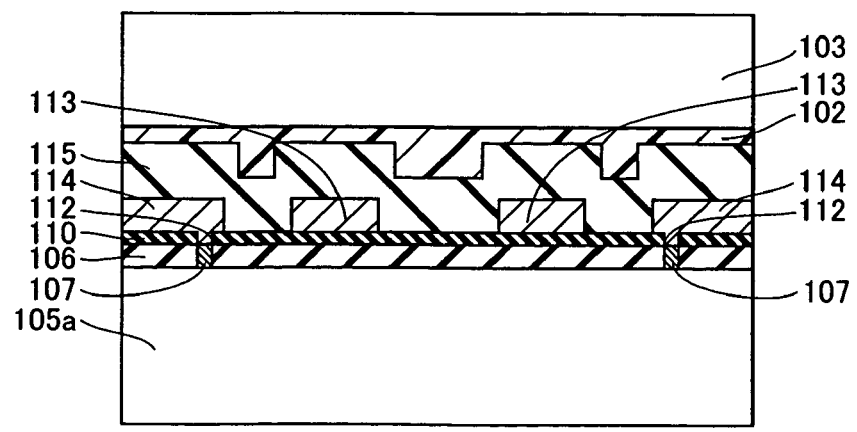
Figure 44:
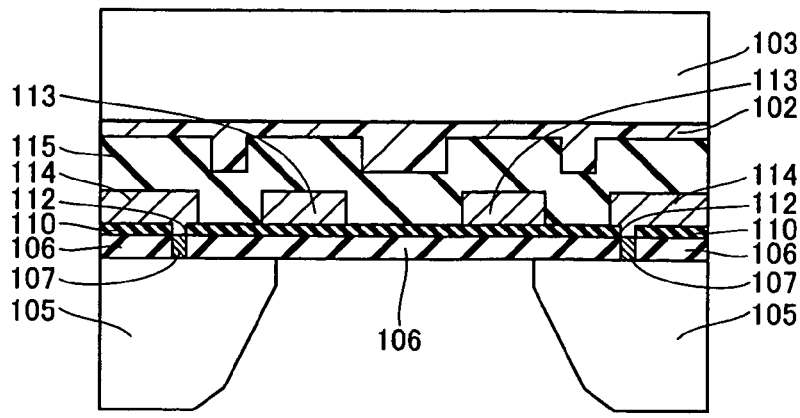
Figure 45:
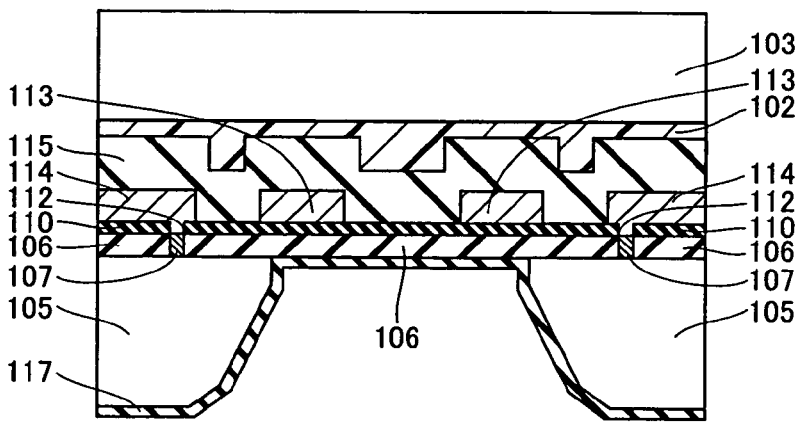
Figure 46:
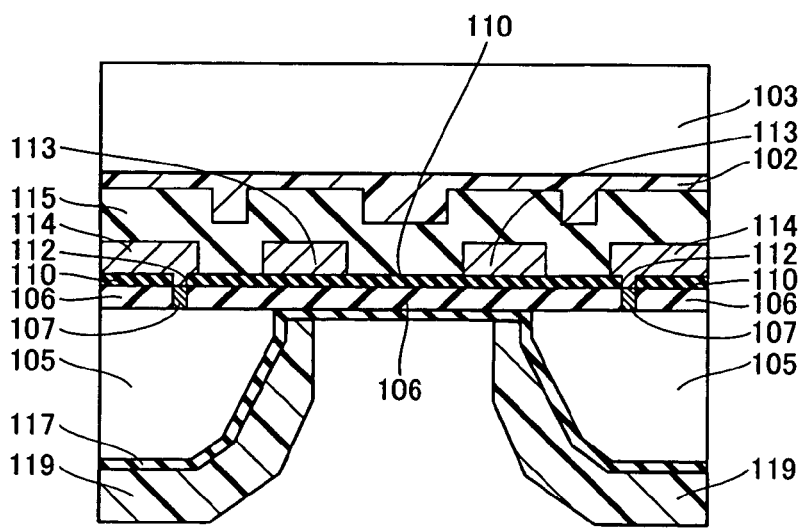
Figure 47:
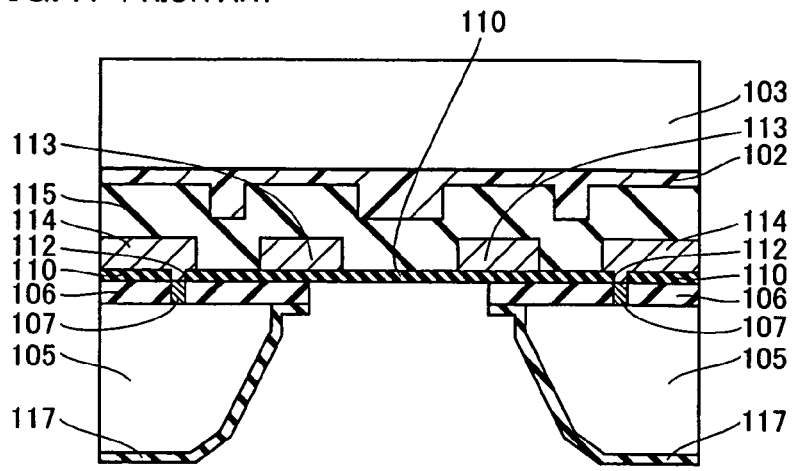
Figure 48:
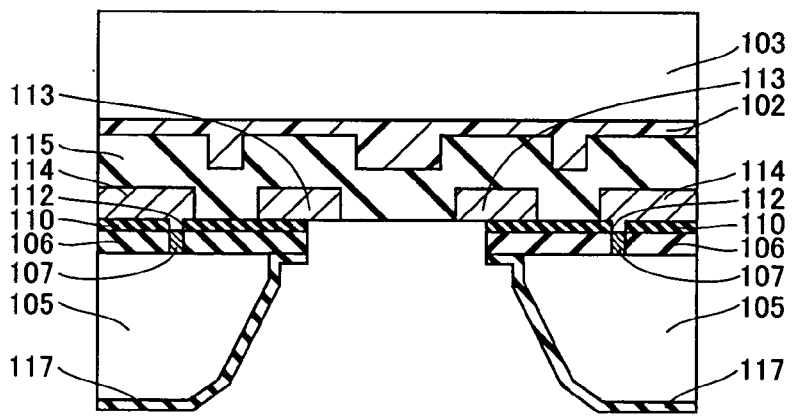
Figure 49:
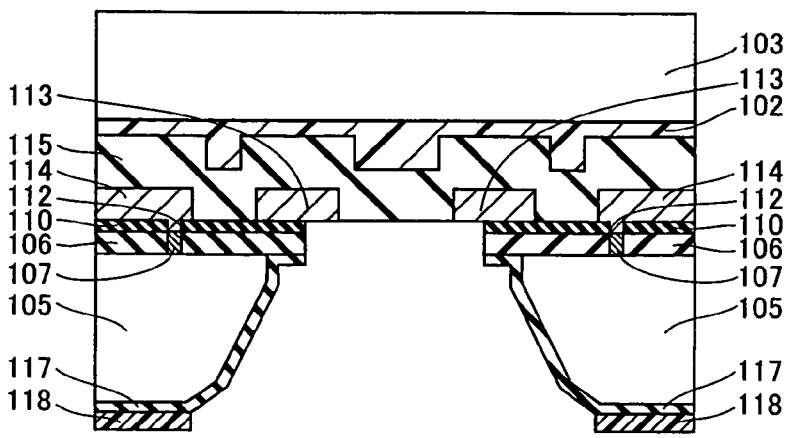
Figure 50:
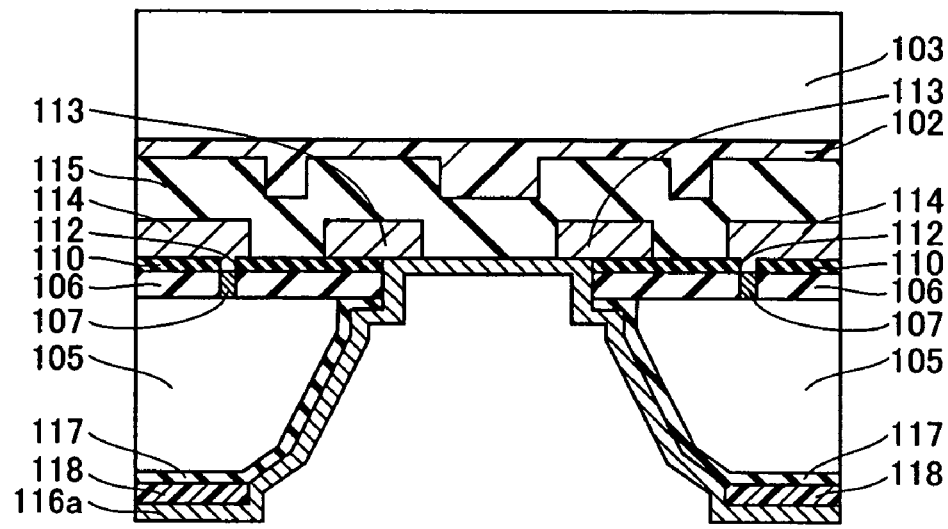
Figure 51:
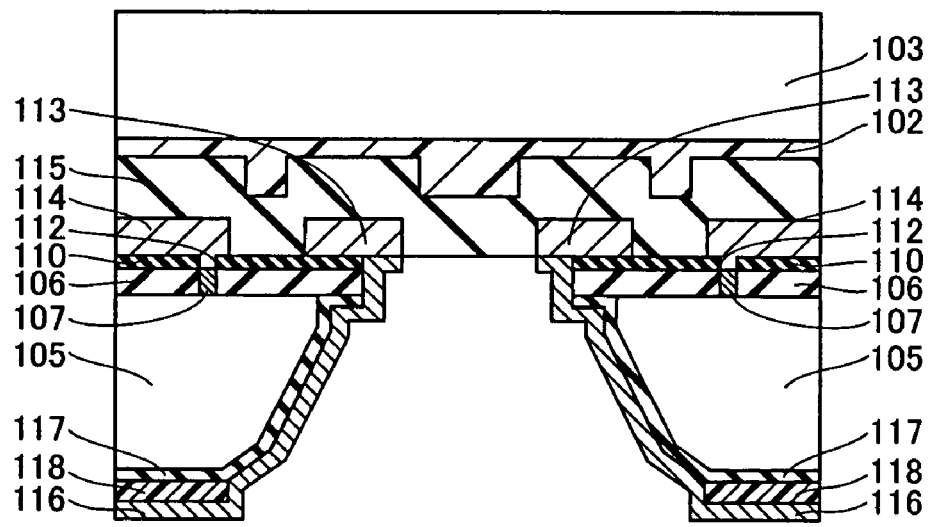
Figure 52:
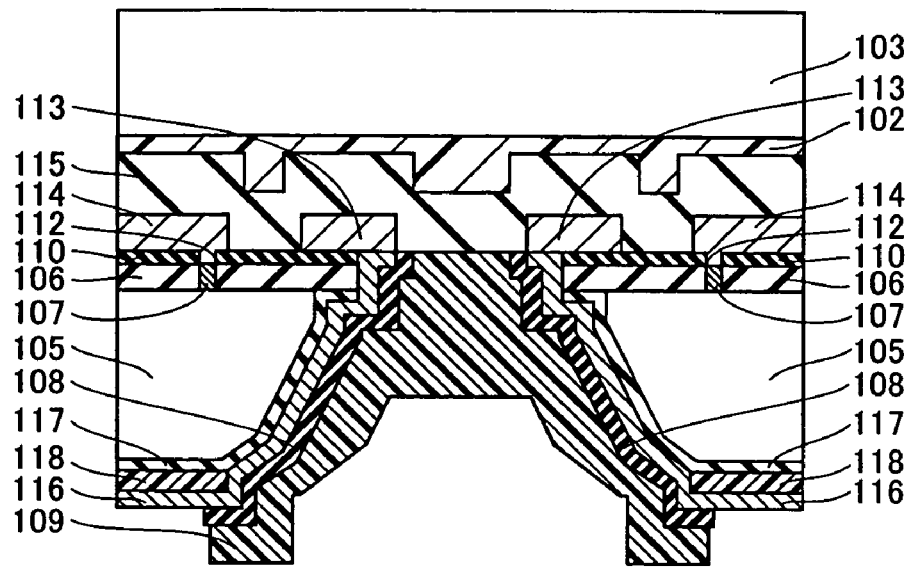
Figure 53:
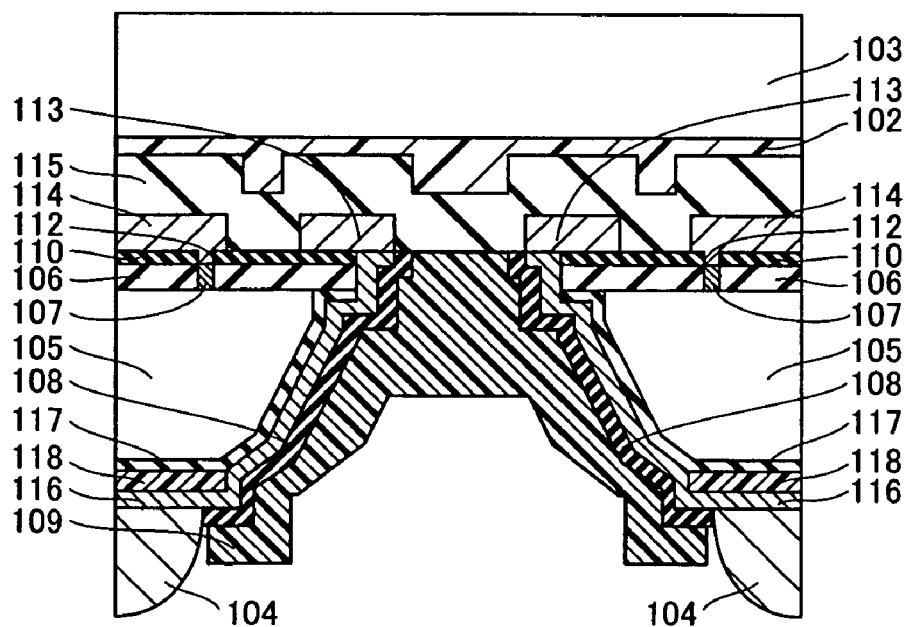
Figure 54:
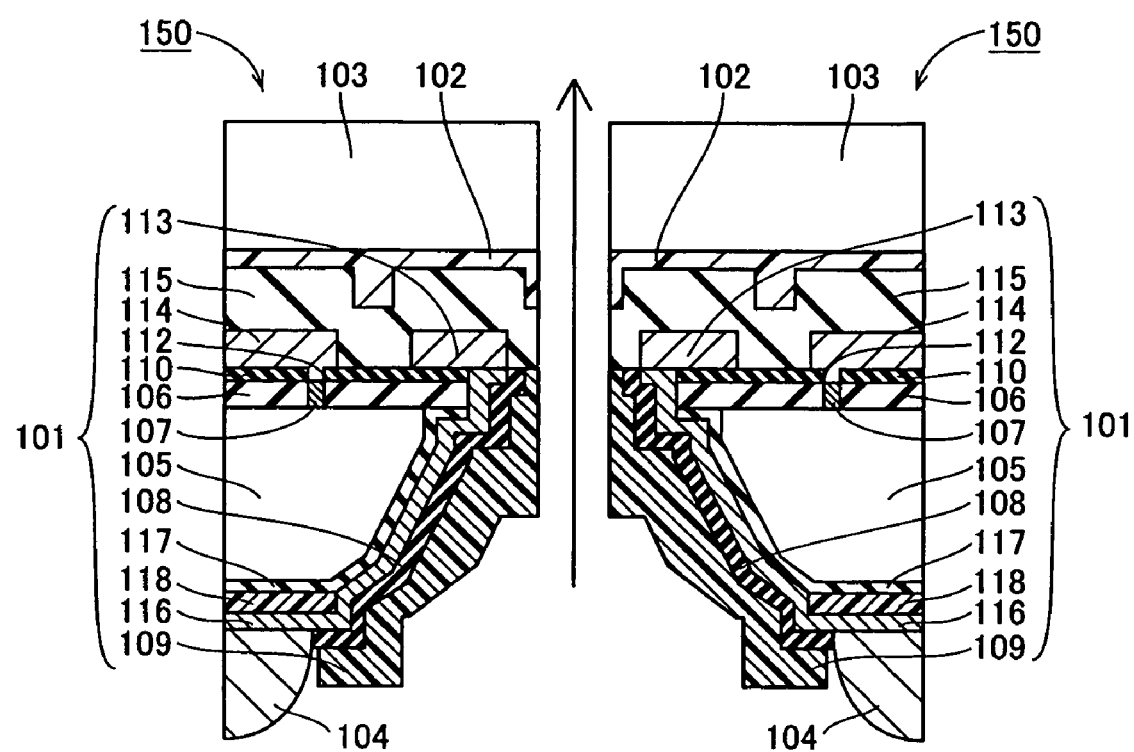

According to the second embodiment, the resist films 39 are employed as masks for performing wet etching from under the insulator films 17 and 6 with hydrofluoric acid or the like similarly to the aforementioned first embodiment, thereby exposing partial regions of the lower surfaces of the extension pads 33 and the lower surface of the region of the insulator film 30 located between the adjacent pair of extension pads 33, as shown in FIG. 29. At this time, the insulator films 17 and 6 of $SiO_2$ can be partially removed through the single etching step.

Thereafter steps similar to those of the aforementioned first embodiment shown in FIGS. 13 to 18 are carried out as shown in FIGS. 30 to 35, for forming the semiconductor device 60 according to the second embodiment as shown in FIG. 19.

According to the second embodiment, as hereinabove described, the insulator film 6 consisting of the single material ($SiO_2$) is formed to be in contact with the upper surface of the semiconductor chip 5 while the extension pad 33 is formed to be in contact with the upper surface of the insulator film 6 through the opening 31 of the insulator film 30 consisting of SiN formed on the insulator film 6 so that only the insulator film 6 consisting of the single material ($SiO_2$) is present between the upper surface of the semiconductor chip 5 and the extension pad 33, whereby the insulator film 6 located between the upper surface of the semiconductor chip 5 and the extension pad 33 can be partially remove through the single etching step for exposing the lower surface of the extension pad 33 dissimilarly to a case where a plurality of insulator films of different materials are present between the upper surface of the semiconductor chip 5 and the extension pad 33. Thus, the fabrication process for the semiconductor device 60 can be simplified.

According to the second embodiment, the extension pad 33 is formed only in the opening 31 of the insulator film 30, and hence mask alignment with respect to a resist film for patterning the metal film 33a by photolithography and etching must be more precisely performed as compared with the first embodiment having the extension pad 13 formed to partially extend on the insulator film 10.

The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the insulator film 6 employed as the first insulator film of the present invention coming into contact with the lower surface of the extension pad 13 or 33 is constituted of the single layer of $SiO_2$ in each of the aforementioned embodiments, the present invention is not restricted to this but the insulator film 6 (first insulator film) may alternatively be constituted of a plurality of layers consisting of the same material.

While the insulator film 17 for isolating the semiconductor chip 5 and the wire 16 is made of $SiO_2$ in each of the aforementioned embodiments, the present invention is not restricted to this but the insulator film 17 may alternatively be made of another material removable by etching means identical to that for the insulator film 6 formed on the upper surface of the semiconductor chip 5. When the insulator film 6 formed on the upper surface of the semiconductor chip 5 is made of SiN, for example, the insulator film 17 for isolating the semiconductor chip 5 and the wire 16 from each other may also be made of SiN. Also in this case, the lower surface of the extension pad 13 can be exposed by partially removing the insulator film 17 for isolating the semiconductor chip 5 and the wire 16 from each other and the insulator film 6 formed on the upper surface of the semiconductor chip 5 through single etching, whereby the fabrication process can be inhibited from complication. Further alternatively, the insulator films 17 and 6 may be made of different materials removable by the same etching means (etching solution or the like).

While the insulator film 17 for isolating the semiconductor chip 5 and the wire 16 from each other and the insulator film 6 formed on the upper surface of the semiconductor chip 5 are partially removed by wet etching in each of the aforementioned embodiments, the present invention is not restricted to this but the insulator film 17 for isolating the semiconductor chip 5 and the wire 16 from each other and the insulator film 6 formed on the upper surface of the semiconductor chip 5 may alternatively be partially removed by dry etching.

While the glass substrate is bonded to the upper surface of the insulator film formed to cover the wire and the extension pad through the resin layer of epoxy resin in each of the aforementioned embodiments, the present invention is not restricted to this but a color filter may be formed on the upper surface of the insulator film formed to cover the wire and the extension pad through the resin layer for bonding the glass substrate to the upper surface of the color filter through the resin layer of epoxy resin.

While the insulator film formed on the upper surface of the semiconductor chip and that formed to cover the side surface and the lower surface of the semiconductor chip are made of $SiO_2$ in each of the aforementioned embodiments, the present invention is not restricted to this but the insulator films may alternatively be made of another material such as HTO, BPSG, SOG or a composite thereof substantially mainly composed of $SiO_2$.

What is claimed is:

1. A semiconductor device comprising:
    a first insulator film, consisting of a single material, formed to be in contact with the upper surface of a semiconductor chip including a circuit;
    a first wire formed to be in contact with the upper surface of said first insulator film;
    a second wire formed to extend along the side surface and the lower surface of said semiconductor chip and connected to the lower surface of said first wire exposed by partially removing said first insulator film; and
    a third insulator film, provided between said semiconductor chip and said second wire to isolate said semiconductor chip and said second wire from each other and formed to cover a prescribed region of the lower surface of said first insulator film, consisting of a material removable by etching means substantially identical to that for said first insulator film.

2. The semiconductor device according to claim 1, wherein said etching means includes an etching solution employed for wet etching.

3. The semiconductor device according to claim 1, wherein said third insulator film consists of the same material as said first insulator film.

* * * * *